United States Patent [19]

Wood

[11] Patent Number: 4,473,795

[45] Date of Patent: Sep. 25, 1984

[54] SYSTEM FOR RESIST DEFECT MEASUREMENT

[75] Inventor: Robert L. Wood, Wappingers Falls, N.Y.

[73] Assignee: International Business Machines Corporation, Armonk, N.Y.

[21] Appl. No.: 468,907

[22] Filed: Feb. 23, 1983

[51] Int. Cl.³ .................. G01R 31/12; H01L 7/00
[52] U.S. Cl. .................................. 324/54; 29/574
[58] Field of Search ............... 324/96, 51, 52, 54, 324/71.1, 73 PC, 71.3, 158 R; 118/712, 713; 29/574; 427/8, 10

[56] References Cited

U.S. PATENT DOCUMENTS

| | | | |
|---|---|---|---|
| 3,373,353 | 3/1968 | Harris | 324/54 |
| 3,772,520 | 11/1973 | Varker | 324/54 |
| 3,792,458 | 2/1974 | Smith | 324/54 |
| 4,296,372 | 10/1981 | Feuerbaum | 324/71.3 |

OTHER PUBLICATIONS

Gale et al., "A Simple Optical Thin Film Deposition Monitor . . . ", J. Vac. Sci. Tech., 20(1), Jan. 1982.
Leachton, "Metal Deposition Technique for Pinhole Analysis . . . ", IBM Tech. Discl. Bull., vol. 19, No. 9, Feb. 1977.
Gniewek, "Evaluating Insulation Layer Quality . . . ", IBM Tech. Discl. Bull., vol. 14, No. 5, Oct. 1971.

Primary Examiner—Stanley T. Krawczewicz
Assistant Examiner—Jose M. Solis
Attorney, Agent, or Firm—Sughrue, Mion, Zinn, Macpeak and Seas

[57] ABSTRACT

A non-destructive test system for determining the number, size and location of pinhole defects in insulative coatings on a semiconductor substrate employing photocathodic current measurement at the semiconductor surface. This current is produced by contacting the coated semiconductor with an aqueous electrolyte, applying a small electrical bias with respect to a metal electrode, and scanning a small, focused light beam over the semiconductor surface. The frequency of current peaks produced is proportional to defect density. Current peaks provide data relative to defect size and location is correlated relative to scanning data to determine defect location.

20 Claims, 5 Drawing Figures

FIG. 5
MOS-PED CORRELATION

SYSTEM FOR RESIST DEFECT MEASUREMENT

BACKGROUND OF THE INVENTION

This invention relates to systems for the non-destructive detection of damage or imperfections in insulative coatings on the surface of a semiconductor substrate. In particular, it relates to a test method and apparatus for determining defect density, location, and size in insulative coatings.

The manufacture of VLSI devices requires lithographic fabrication steps having characteristic features in the order of 1 micron or less. In order to achieve these exceptionally small dimensional tolerances, e-beam lithography together with deep UV resist techniques are necessary to provide both high sensitivity and high resolution. This is accomplished utilizing e-beam resists which are employed at a thickness over the substrate which approaches the smallest dimension of the exposed pattern. Such an exceptionally thin layer of resist is necessary since, at a given exposure dose, the thickness of the resist is a primary factor in determining its resolution.

In contrast to known contemporary processes which use a resist thickness in excess of 1.5 microns, future submicron process yields are highly dependent on resist defect levels. This dependency occurs due to a dramatic increase in defect density as a function of decreasing resist thickness. Moreover, the probability of device damage increases exponentially with increasing defect density. Therefore, it is apparent that final device yield is strongly related to resist defect levels. Given this requirement, users and manufacturers of resist in a submicron process have a standing requirement for a nondestructive test method of evaluating resist defect behavior. Users could employ such a test to diagnose process problems relating to defects without actually fabricating and testing devices. Resist manufacturers have a compatible need for such a test as a routine quality control technique.

Within the prior art, a variety of techniques are currently employed for evaluating defects in various resist coatings. One known quality control system relies on the transportation of defects into a thermal oxide film by wet etching. A second etching produces pits in the underlying silicon substrate. The etched pits are visually counted with the aid of a microscope in order to determine defect density. It has been established by empirical data and actual experience that this procedure is unsatisfactory for distinguishing high and low defect levels in various types of resist which are used for semiconductor lithography. The inability of this optical test process for judging resist quality is demonstrated by the fact that commonly one resist lot produces acceptable semiconductor yields while another resist lot produces very low yields yet, both upon optical evaluation, tested to have equivalent defect densities.

A more sensitive technique has been established to accurately distinguish defect densities in high and low defect resists of the type employed in optical quality control test systems. This more sensitive method involves transporting resist defects into a thermal oxide film by wet etching. This is followed by measuring dielectric breakdown voltage of the remaining oxide utilizing approximately 250 metal-oxide-semiconductor (MOS) capacitors fabricated on the wafer. The MOS technique realistically therefore reflects the effective defect density of a test resist since, device (capacitor) yield is actually measured. It is applicable to determine defects in the order of less than 1 $\mu$m finding application in 500 Å inorganic dielectrics. However, this test methodology does not provide information concerning defect size or other salient characteristics such as location. Such information is key in providing a complete envelope of defect yield data, vis-a-vis resist materials or process problems related to such defects.

A more significant deficiency of the MOS capacitor technique is that it requires access to the actual device manufacturing area since the test relies on availability of oxidation furnaces, clean process stations, metal evaporation, etc. Accordingly, while the MOS capacitor test is an excellent method for evaluating resist defects per se, it is logistically impractical for routine monitoring of resist quality.

Techniques of mapping semiconductor wafers in a non-destructive manner using chemical techniques are known in the prior art. In IBM TDB, Vol. 18, No. 12, May 1976, p. 4012, a system is described in which an array of light-emitting diodes is employed in order to illuminate different areas of the wafers so that cathodic current information is obtained on different segments of the wafer. The system described in IBM TDB, Vol. 18, No. 11, April 1976, p. 3623 utilizes a laser to scan the semiconductor material in order to map the depletion region. In this system, defect regions produce a decrease in current so that a map of semiconductor quality can be obtained. A determination of actual pinhole size is not made using these techniques.

Another technique of nondestructive testing of semiconductor articles is described in U.S. Pat. No. 4,125,440 wherein the semiconductor substrate is immersed in electrolyte solution which is held on a test stand by means of a vacuum holder. The surface is uniformly illuminated at a light density in the range of 50-75 foot candles and the substrate is negatively biased with respect to the electrolyte at a voltage level in the range of 50-65 volts. This produces hydrogen gas bubbles at electrically active damage sites indicative of defect density per se. Thus, this prior art technique also maps but does not actually measure pinhold-type defects.

Other prior art of less significance utilizing electrolytic cells for determining the integrity of semiconductor materials are disclosed in U.S. Pat. Nos. 2,805,347; 3,628,017; 3,755,026; 4,028,207; and 4,188,267. These various techniques relate to test systems for determining pinhole locations or density and do not provide comprehensive data concerning pinhole density pinhole location and pinhole size in a single test.

The application of a defect detector for use in insulative coatings employing an electrolyte system for purposes of mapping, that is, to outline a distribution of defects in addition to determining pinhole size, is disclosed in IBM TDB, Vol. 20, No. 1, June 1977, pp. 432-433. As disclosed therein, defects in an insulative layer on a silicon wafer are detected by determining current-voltage characteristics of a signal which is applied across the insulative layer and its substrate utilizing a platinum electrode immersed in a NaCl solution together with an electrical contacting pin contacting the substrate. The pinholes themselves are rendered visible, vis-a-vis a plating effect which decorates the defects when, if NaCl is used as the electrolyte, a white film outlines the defect or distribution thereof optical evaluation follows.

A technique for measuring the thickness of a dielectric layer on a conductive substrate is disclosed in U.S. Pat. No. 3,975,681 utilizing an electrode pair wherein an electrode is placed in a tube with one electrode having a capillary opening contacting the surface of the dielectric layer whose thickness is to be measured. The circuit is complete by utilizing this conductive substrate as the anode such that the thickness of the dielectric is measured as a function of the highest applied voltage which does not produce an increase in current flow in the system. Such a technique, however, is not readily applicable for a determination of defect densities and sizes.

Other prior art considered to be less significant than that discussed herein, vis-a-vis the present invention, comprises technology directed to other electrolytic techniques for measuring semiconductor imperfections as typified by U.S. Pat. Nos. 3,129,148; 3,366,554; 3,379,625; 3,384,556; 3,408,270; and 3,366,040. Finally, other electrolytic techniques for the manufacture of semiconductor components but not specifically directed to measuring and testing systems per se that have been considered are typified by U.S. Pat. Nos. 3,265,599; 3,267,014; 3,738,917; and 3,890,215.

A hallmark deficiency of the prior art is that it does not provide comprehensive data for determining the number, size, and location of pinhole defects in very thin insulator coatings. Various optical mapping techniques are either time-consuming and/or destructive and therefore incapable of precisely locating pinhole defects in the surface of such coatings. Other techniques, while providing the necessary sensitivity, do not afford turn-around time commensurate with processing requirements. Still other techniques, primarily chemical, do not provide the necessary sensitivity for use over a broad range of insulative coating applications, such as resist or other inorganic films typified by $SiO_2$, quartz, $Si_3O_4$ and various polymer coatings. Other known techniques, such as bubble trail, liquid crystal techniques and the like, suffer from the same disadvantages of the prior art discussed herein.

SUMMARY OF INVENTION

It is therefore an object of the present invention to define a non-destructive test system for the determination of the number, size, and location of pinhole defects in insulative coatings on a semiconductor substrate.

Yet another object of this invention is to define a non-destructive test system providing the necessary sensitivity and accuracy for defect detection in submicron film coatings.

A still further object of the invention is to define a single test system for providing comprehensive defect data relative to pinholes in insulative coatings that overcomes the deficiencies of the prior art.

These and other objects of this invention are attained in a non-destructive test system that determines the number, size, and location of pinhole defects in insulative coatings in a single test mode. While finding primary application in submicron resists, the invention is also applicable to other insulative coatings, such as $SiO_2$, quartz, $Si_3O_4$ and various polymer coatings. In accordance with the present invention, a photocathodic current measurement at the semiconductor surface takes place with the current produced by contacting the coated semiconductor with an aqueous electrolyte and applying a small electrical bias with respect to a metal electrode. A small surface of the semiconductor is scanned utilizing a narrow focused beam of white light to allow current to flow through the electrolyte whenever the beam falls on a portion of the semiconductor contacting the electrolyte due to a pinhole in the coating. This current is detected utilizing conventional current measuring techniques. The frequency of the maximum current thus produced is dependent on the density of the pinholes in the coating. The position of the light beam at any given maximum current indicates the location of that corresponding pinhole. The magnitude of the maximum current is a function of the amount of semiconductor in contact with the electrolyte and therefore is a finite measure of pinhole size.

This invention will be described in greater detail with respect to the drawing and the description of the preferred embodiment that follows.

DESCRIPTION OF THE PREFERRED EMBODIMENT

Figure 1:
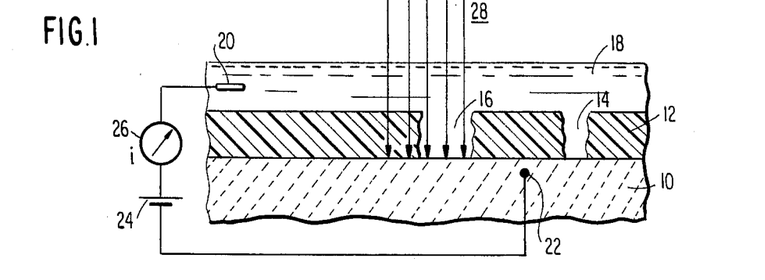
FIG. 1 is a schematic elevation view of a device under test explaining the operational principles of this invention.

Referring first to FIG. 1, the principles of the present invention will be discussed. This invention relies on the principle that electrical current flow between a polarized semiconductor and a metal electrode pair separated by an electrolyte can, under proper conditions, be enhanced by exposing the semiconductor to light energy. In FIG. 1, the polarized semiconductor, a P-type Si wafer 10, has thereon a processed resist 12 which may have pinhole defects 14, 16. The electrolyte 18 typically $H_2SO_4$ covers the processed resist 12. A metal electrode pair is defined by a platinum electrode 20 immersed in the electrolyte 18 and a second electrode 22 in contact with the wafer 10. The circuit is completed by a DC power source 24 and an ammeter 26.

In accordance with the present invention, irradiation 28 supplied from a scanning light beam provides light energy in excess of the semiconductor band-gap and produces separated electron-hole charge carriers within the space-charge region present at the semiconductor-electrolyte interface. With a P-type semiconductor, excess holes generated by irradiation are drawn into an external circuit defined by the electrodes 20, 22, source 24, and meter 26 by cathodic polarization of the semiconductor 10. Excess electrons are driven toward the electrolyte solution where they can facilitate the electrochemical reduction of an electro-active solute. This electrochemical reduction results in a current flow in the circuit thus described between the semiconductor and the metal electrode 20. The current density is proportional to the light intensity.

If the semiconductor 10 is coated with an insulative material, such as resist 12, then, photo-assisted electrochemical activity can occur only at defect sites in the resist film, that is, where the electrolyte is physically in contact with the illuminated semiconductor due to pinholes 14, 16. As shown in FIG. 1, at all other locations since no electro-chemical reaction can occur, no current flows. Moreover, if the illuminating light is condensed to a small beam, that is, appropriately focused and then scanned across the resist coated semiconductor, then, the exact location and size of each defect passing through the light beam can be identified. Thus, not only the location of a particular defect, such as pinhole 14 and its size can be determined, but also, that defect can be differentiated from a second defect, such as defect 16 both in terms of location and size. By detecting the current frequency, the density of pinholes in the coating can be determined. It is on this fundamental basis that the system shown in FIG. 2 operates as a preferred embodiment of this invention.

Figure 2:
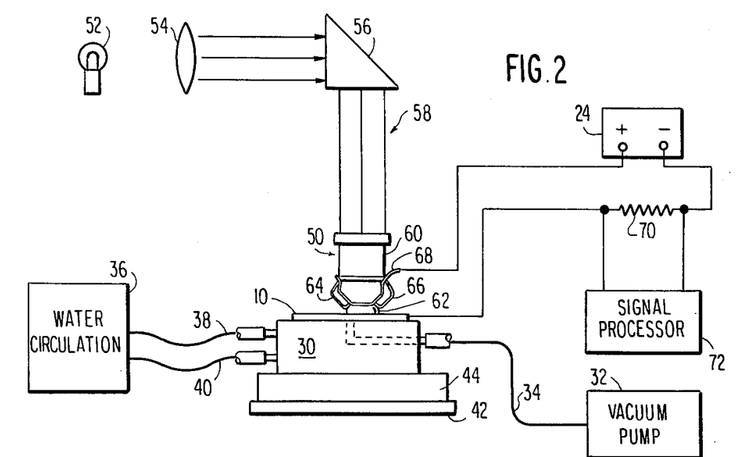
FIG. 2 is a schematic system diagram of the test structure for practicing this invention according to a first preferred embodiment.

Referring now to FIG. 2, a schematic illustration of a complete system for practicing the present invention, is depicted. A resist coated P-type silicon wafer 10 is mounted on a vacuum chuck 30. A source of vacuum 32 coupled to the chuck via a hose 34 provides the necessary hold-down action to maintain the wafer 10 in a stationary position on the chuck 30. The temperature of the chuck and therefore that of the wafer is maintained at a constant level, preferably near ambient, by means of a circulating constant temperature bath. This bath comprises a circulating water unit 36 having conduits 38, 40 defining a feed and return path to the chuck 30. Thus, by circulating water through the body of the chuck, temperature stability of the wafer is maintained.

The chuck is mounted on a microscope stage 42 having thereon an X-Y table 44. The table moves the chuck 30 at a known rate, for example, 0.5 mm/sec. by means of servos in either the X or Y-direction. Alternatively, the microscope stage 42 could be directly driven by external servos to achieve the same X-Y motion. Movement of the chuck is controlled so that preselected areas of the wafer 10 are scanned beneath an objective 50. The microscope 50 may typically have a 40x objective wherein, light from a source 52 is focused by lens 54 and reflected by prism 56 through the body 58 of the microscope. It is brought into focus on the wafer surface via the objective 60.

Accordingly, light from source 52 is directed through the microscope to illuminate a circular area generally 0.5–5 mm in diameter with the size dependent on the objective power and numerical aperture. As shown in FIG. 2, the narrow gap between the objective and the wafer is bridged with a fixed, microliter range volume of an electrolyte solution containing a reducable solute 62. The electrolyte is typically dilute aqueous $H_2SO_4$. Electrical contact to the solution is made with a platinum wire 20 secured to the objective 60. The wire is looped beneath the objective forming open loops 64 and 66 with a second contact point 68 on the objective 60. Thus, the wire loops 64 and 66 of the platinum wire 20, in addition to providing electrical contact, support an electrolyte droplet 62 by surface tension. This technique of surface tension support is important to keep the droplet stationary with respect to the objective given relative movement of the wafer 10, vis-a-vis the objective. Consequently, movement of the wafer is facilitated while, at the same time, maintaining electrolyte contact and droplet configuration.

A suitable potential produced by DC source 24 is 2 V placed across the wafer 10 and the platinum electrode 20 such that the wafer is negatively biased. Current flows through the electrolyte droplet 62 and is measured as the voltage drop across a 1000 $\Omega$ resistor 70. The voltage may also be displayed on a recorder or supplied to a signal processing unit 72.

For example, with a 0.5% aqueous sulfuric acid electrolyte, hydrogen ions serve as the reducable solute, leading to cathodic hydrogen evolution at each illuminated resist defect site. This can be demonstrated according to the following reactions:

$$H_2SO_4 + H_2O \rightarrow H_3O^+ + HSO_4^- \qquad (1)$$

$$H_3O^+ + Si + e_v \rightarrow SiH + H_2O \qquad (2)$$

$$SiH + H_3O^+ + e_c \rightarrow Si + H_2O + \uparrow H_3 \qquad (3)$$

In the above equations, $e_v$ and $e_c$ are respectively valence and conductive band electrons. Consumption of conductive band electrons as indicated in Equation (3) produces a current flow which is proportional to the area of the reaction surface. Consequently, the steady state current thus produced is proportional to defect size.

By movement of the wafer beneath the light beam as a function of the X-Y table, each resist defect passing through the field of illumination produces a current peak on a recorder or data processing unit 72. The position of a given peak is indicative of the exact location of the corresponding resist defect. Thus, by knowing the position of the wafer as a function of X-Y table position (for example, by control via processor 72), exact defect position can be correlated by determining current peaks. Current peak amplitude is proportional to defect size. Hence, by determining scan parameters, the entire resist surface can be sampled by the light beam providing a map of all defect locations. Typically, various raster scan patterns may be utilized to insure that the entire surface is sampled. Alternatively, smaller discrete representative sites may be sampled to produce a cross-section of resist defect levels. Thus, by sampling and integrating data a model of the entire defect surface can be produced.

The choice of light beam diameter produced by the objective 60 is dependent on resist defect density. A larger defect density requires a smaller light beam to resolve adjacent defects. That is, as shown in FIG. 1, if the spacing between defects 14 and 16 is relatively small, then a smaller light beam diameter 28 is required to provide data for only one defect at a time, that is, not overlapping two adjacent defect sites. The selection of scan rate is dependent on several factors including defect density, resist wetting properties, and electronic response time. This parameter is optimized by calibration techniques well established in this technology.

Figure 3:
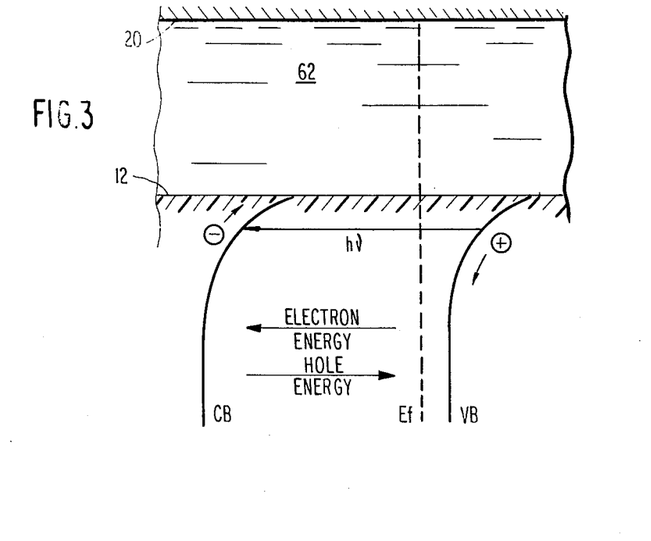
FIG. 3 is a chart defining the band model for the electrode process in accordance with the present invention.

FIG. 3 shows current and voltage as a function of distance in a photo-assisted reaction shown in Equation (3) herein. A platinum anode 20 and electrolyte droplet 62 are shown together with the interface of the resist 12 on top of the silicon wafer forming the photocathode. The relationships of electron energy and hole energy to the current and voltage curves are shown at the bottom of the figure.

FIG. 3, then, represents a Band model for the electrode process; this figure depicts the energetics involved in the photoconduction of charge at the semiconductor/electrolyte interface. The lines labeled CB and VB are, respectively, representations of allowed energy levels for electrons which are free to conduct charge (conduction band) and those which are involved in lattice bonding and cannot conduct charge (valence band). In p-type silicon, electrons constitute the minority charge carriers, hence the CB energy level is relatively sparsely populated. Application of heat or light provides sufficient energy for some electrons confined to the VB to "jump" the forbidden bandgap and assume a CB energy level. In this state the electron has mobility and may conduct charge, but in p-type silicon the relatively high concentration of electron deficiencies (holes) within the VB raises the likelihood that free electrons will quickly "recombine" and be returned to their VB energy level. Thus, charge conduction via irradition produced electrons requires localized depletion of holes within the semiconductor by applying a negative bias. The effect of depletion is represented by 'bending' of the CB and VB energy levels in FIG. 3. This bending allows VB holes to minimize their energy by moving away from the semiconductor/electrolyte interface while electrons may minimize their energy by moving toward the semiconductor surface. With electrons and holes effectively separated, the probability of recombination is reduced, and charge conduction can proceed. Thus, two conditions must be met for conduction of charge through the semiconductor; presence of negative electrical bias on the silicon, and illumination of the silicon surface. With a constant applied bias, current is regulated only by illumination.

Figure 4:
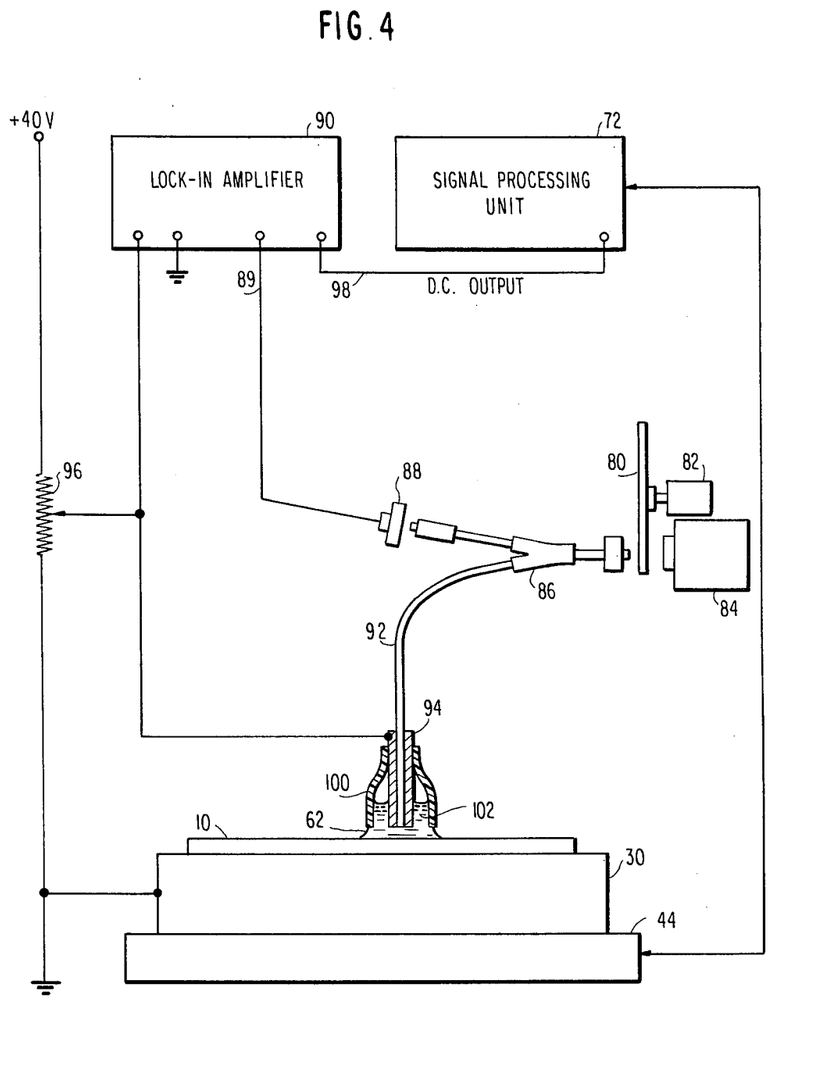
FIG. 4 is a schematic system diagram of the test structure for practicing this invention in accordance with a second preferred embodiment of this invention.

A second preferred embodiment of the photo-electrochemical defect detector (PED) is shown in FIG. 4. The enhancements of this embodiment result basically from use of a more sensitive electronics and more effective wafer illumination methodology. Common structure is identified by the same number as in the first embodiment. The operating principle in both embodiments is the same: a silicon wafer 10 is made to behave as a photodiode in a liquid-junction cell arrangement. However, in the second embodiment, photo-current is modulated (turned on and off rapidly) by illuminating the wafer with chopped light, as shown in FIG. 4. This is effected by interposing a spinning metal disk 80 having evenly spaced holes about its outer edge in the light path. The chopper is driven by a motor 82. The size of the disk, its angular velocity and the spacing of the holes are arranged such that the light is effectively turned on and off ~900 times per second. The duration of the on (light) period is equal to that of the off (dark) period.

The light beam thus modulated from a source 84, typically a tungsten lamp, is focused on the entrance aperture of a bifurcated optical fiber bundle 86 having a bundle diameter of about 2 mm. The optical connectors shown for the fiber bundle are well known in the art. One-half of this incident light is diverted through one leg of the bundle and allowed to illuminate a solid-state silicon photodiode 88. This photo diode, together with its associated biasing voltage and load resistor (not shown) produces an alternating current voltage in response to the incident modulated light. This a.c. voltage signal 89 drives the reference channel of a phaselock (lock-in) amplifier 90.

The second half of the light beam is brought into close proximity with the test substrate via the second leg 92 of the optical fiber bundle. The substrate is thereby illuminated with a circular spot of light which is slightly larger than the diameter of the bundle. Signals produced by pinholes in the substrate coating are detected by the stainless steel anode 94 which is concentric with the optical fiber bundle. These signals take the form of an AC voltage across the voltage divider—load resistor 96, with a frequency equivalent to the light chopping rate (900 HZ).

This AC voltage, having the same frequency and phase as the reference signal (produced by the solid-state photo-diode) is selectively amplified by the phase-lock amplifier 90, producing a DC output 98 which is proportional to the magnitude of the AC input. This selective amplification scheme provides much greater signal-to-noise ratio, allowing faster scanning rates (up to about 25 mm/sec) and improved resolution over the former system. Greater S/N ratio also permits use of low conductivity electrolytes for sensitive coating which might otherwise degrade in contact with $H_2SO_4$. For example, plain de-ionized water (containing from 1-5% isopropyl alcohol for wetting action) may be used as the electrolyte medium of choice for measurement of pinhole density in photo-resist layers.

FIG. 4 also illustrates another important difference between this embodiment and FIG. 2. Specifically, the electrolyte confinement system is different utilizing the inverted plastic sleeve 100 cylindrical with the anode 94. The anode 94, typically stainless steel, receives at its upper end the optical fiber bundle 92 which extends concentrically inside the anode to the bottom edge. The bottom edge is positioned about 0.5 mm above the surface of the substrate 10.

The electrolyte retention cup as shown in FIG. 4 is sealed at its upper end to the anode 92. It then flares outward to define a chamber 102 for confining electrolyte 63 deposited therein by capillary action. The chamber is typically about 6 mm in diameter. As shown, when the probe is positioned over the substrate 10, the electrolyte bridges the gap downward to the substrate surface by surface tension.

In this embodiment the anode 94 is in electrical contact with the electrolyte 62 and the retention cup is a plastic dielectric. Thus the anode replaces the wire loops 64 and 66 of the FIG. 2 embodiment. The plastic retention cup produces a stable electrolyte containing medium for uniform droplet definition and retention.

The performance of this invention can be compared to the prior art by comparative testing utilizing resists of well characterized defect behavior. The invention was compared to the prior art MOS capacitor and optical systems discussed herein. Specific resist process and testing conditions are delineated in Tables I and II.

TABLE I

| Positive Resist Process | |
| --- | --- |
| Wafer type | 2¼" boron doped silicon, orientation <100>, resistivity 11-25 Ω-cm |
| Adhesion promoter | Silane Primer |
| Apply | Positive resist spin coat to 1.0 ± 0.1 μm |
| Prebake | 85° ± 2° C. hotplate, 30 minutes |
| Develop | Positive resist developer to remove ~ 0.2μ unexposed resist thickness |
| Postbake | 130 ± 5° C. oven, 30 minutes |

TABLE II

| Test Parameters | |
| --- | --- |
| Wafer Bias | −2.0 V |
| Electrolyte | 0.5% (W/V) aqueous $H_2SO_4$ |
| Electrolyte vol. | 10.0 μl |
| Objective | Wild 40x |
| Beam diameter | 0.65 mm |
| Scan rate | 0.4 mm/sec. |
| Sample area per wafer | 1.30 cm$^2$ |
| Recorder range | 1 mV (0–1 μA) |

Typical defect density results for positive resist lots A (high defect) and B (low defect) were obtained utilizing optical, MOS, and photoelectrolysis methods of the present invention. These are categorized as follows:

| | Defects/cm$^2$ | |
| --- | --- | --- |
| Method | Lot A (High defect) | Lot B (Low defect) |
| Optical | 9 | 16 |
| MOS | >50[a] | 15[a] |
| Photoelectrolysis | 143 | 11 |

Note
[a]- defect density calculated from capacitor yield.

Figure 5:
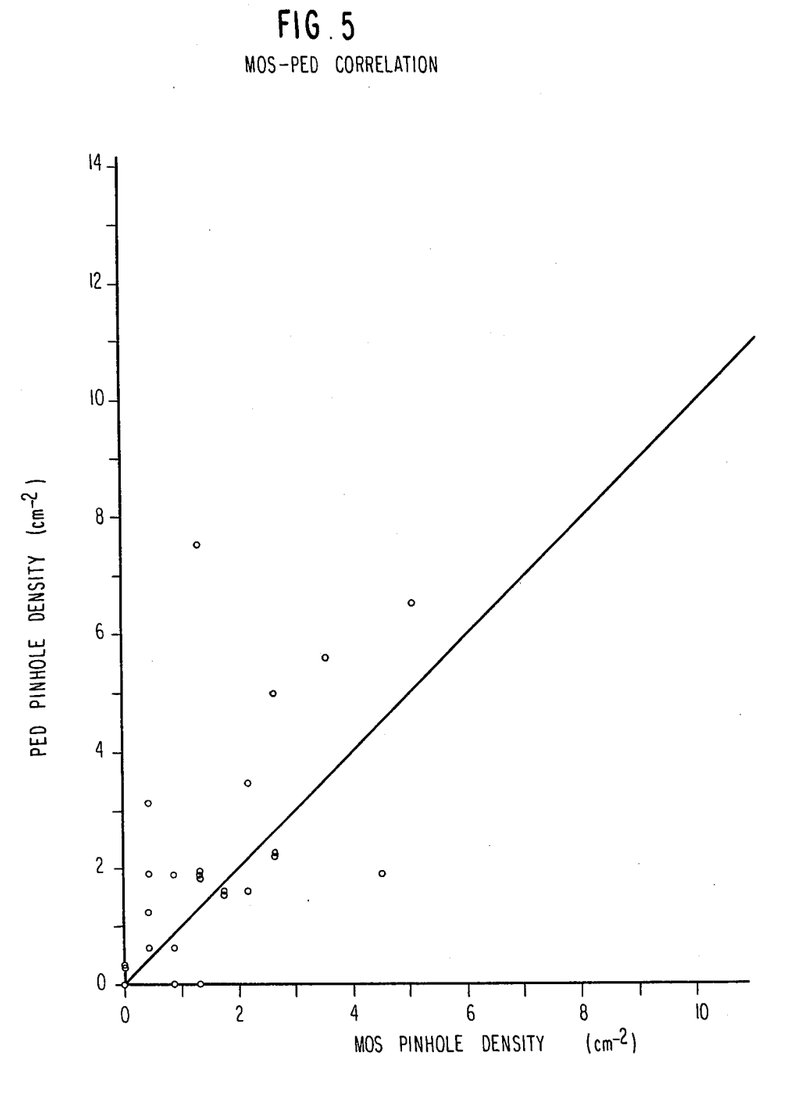
FIG. 5 is a graph plotting pinhole density values obtained by MOS techniques and this invention for a number of samples.

FIG. 5 is a graph showing comparative date of the sensitivity of this invention versus the known MOS technique. Twenty-five examples are tested using resist type and procedures set forth herein in Tables I and II. The similarity in pinhole density values are clearly illustrated in FIG. 5.

It is apparent from this comparative test data, the photoelectrolysis process of the present invention has a sufficient sensitivity to predict the defect behavior of a resist especially in the high defect regions. In addition to high sensitivity, this invention offers significant advantages over available techniques. The invention provides in addition to sensitivity, quantitative defect size data following calibration with artificial defects produced by electron beam lithography. The test system measures defects directly through the resist film; transportation to an oxide film by etching is therefore not required. Consequently, oxide defects do not contribute to the final result as they do in prior art test regimes. Since defect features are not obscured by transportation, better defect characterization is achieved.

Fewer process steps are required and consequently this test system produces results more quickly than any prior art technique currently utilized. Importantly, the test is non-destructive. This enables testing of the result at various points in the process, for example, before and after resist development, then once again after postbake and/or etching. While the invention has been described relative to defect determination on a resist, it is also applicable for other insulative coatings, such as $SiO_2$, $Si_3O_4$, quartz, or polymer coatings.

Thus, the present invention produces a non-destructive test that determines not only size but also number and location of pinhole defects in insulative films. It does not require an optical recording or visual counting techniques which are cumbersome and hallmark deficiencies of the prior art. It is apparent that modifications of this invention can be practiced without departing from the essential scope thereof.

I claim:

1. A test system for measuring and mapping pinhole defects in an insulator coating on a surface of a photoconductor substrate comprising:

optical means for generating a minute spot of light substantially smaller than the area of said surface, means for scanning said spot of light over said surface, means for interposing an electrolyte containing a reducible solute between said surface and said spot of light, means for electrically biasing said substrate with respect to said electrolyte, and means for determining the magnitude and number of current flow variations across said coating and said electrolyte and for determining the scanning position of said spot of light, as respective measurements of the pinhole size, density and location in said coating.

2. The system of claim 1, wherein said means for interposing an electrolyte comprises surface tension means coupled to said optical means for positioning, and maintaining a droplet of electrolyte stationary relative to said minute spot of light as said surface is scanned.

3. The system of claim 2, wherein said surface tension means comprises an electrode structure coupled to said optical means and having a hollow bend to hold said droplet at the end of said optical means.

4. The system of claim 2, wherein said surface tension means comprises a retention cup coupled to said optical means, said retention cup opening towards said surface and defining a cavity for said droplet, wherein surface tension exists between the edge of said cup and said surface to retain said droplet.

5. The system of claim 4 wherein said retention cup is plastic.

6. The system of claim 1, wherein said photoconductive substrate is a silicon semiconductor structure.

7. The system of claim 6, wherein said coating is a photolithographic resist.

8. The system of claim 7, wherein said electrolyte is an aqueous sulfuric acid solution.

9. The system of claim 8, wherein said scanning means comprises means for orthogonal movement of said substrate under a stationary spot of light from said optical means.

10. The system of claim 1, wherein said means for electrically biasing comprises, a power source, an electrode structure coupled to optical means including surface tension means for securing said electrolyte thereto in bridging relationship with said coating and, means to negatively bias said substrate with respect to said electrolyte.

11. The system of claim 1, further comprising means to maintain said photoconductive substrate at a substantially constant temperature.

12. The system of claim 1 wherein said optical means comprises a light source, means for modulating light from said source, and a fiber optic bundle for transmitting said modulated light and projecting it as a spot on said surface.

13. The system of claim 12 wherein said means for electrically biasing comprises a power source, an electrode coupled to said fiber optic bundle and, said means for interposing an electrolyte coupled to said electrode to maintain said electrolyte in contact with said electrode.

14. The system of claim 13 wherein said electrode is an annular metal member surrounding said fiber optic bundle and said means for interposing said electrolyte comprises a retaining cup secured to said electrode and opening downward toward said surface to contain said electrolyte.

15. A method for measuring and mapping pinhole defects in an insulator coating on a surface of a photoconductive substrate comprising the steps of:
disposing an electrolyte between said surface and a source of light and electrically biasing said photoconductive substrate with respect to said electrolyte;
scanning said surface with a minute spot of light substantially smaller than the area of said surface through an electrolyte in contact with and electrically biased with respect to said substrate, wherein said electrolyte contains a reducible solute, and
measuring the magnitude and number of current flow variations and position of said spot of light to determine the pinhole size, density and location of such defects in said coating.

16. The method of claim 15, wherein said photoconductive substrate is a silicon semiconductor structure.

17. The method of claim 16, wherein said coating is a photolithographic resist.

18. The method of claim 17, wherein said electrolyte is an aqueous sulfuric acid solution, and said substrate is negatively biased with respect to said electrolyte.

19. The method of claim 18, wherein said scanning is effected by orthogonal movement of said substrate relative to said spot of light.

20. The method of claim 15, further comprising the step of constraining the volume of said electrolyte about the area of said spot of light.

* * * * *

UNITED STATES PATENT AND TRADEMARK OFFICE
CERTIFICATE OF CORRECTION

PATENT NO. : 4,473,795

DATED : September 25, 1984

INVENTOR(S) : Robert L. Wood

It is certified that error appears in the above-identified patent and that said Letters Patent is hereby corrected as shown below:

Column 6, Line 16, (Equation 3), change "$H_3$" (second occurrence) to -- $H_2$ --.

Signed and Sealed this

Eighteenth Day of August, 1987

Attest:

DONALD J. QUIGG

*Attesting Officer*   *Commissioner of Patents and Trademarks*